United States Patent [19]

Mazumder et al.

[11] Patent Number: 4,631,427
[45] Date of Patent: Dec. 23, 1986

[54] ECL GATE CIRCUIT HAVING INTERNALLY GENERATED REFERENCE VOLTAGES

[75] Inventors: Nikhil C. Mazumder, San Jose; David H. B. Yee, San Francisco, both of Calif.

[73] Assignee: Advanced Micro Devices, Inc., Sunnyvale, Calif.

[21] Appl. No.: 672,768

[22] Filed: Nov. 19, 1984

[51] Int. Cl.$^4$ .......................................... H03K 19/086
[52] U.S. Cl. .................... 307/455; 307/443; 307/356; 307/359; 307/296 R
[58] Field of Search ............... 307/443, 446, 454–455, 307/356, 359, 562, 296 R

[56] References Cited

U.S. PATENT DOCUMENTS 4,276,488 6/1981 Benedict et al. ............... 307/455 X
4,518,876 5/1985 Constantinescu ............... 307/455 X
4,565,976 1/1986 Campbell ........................ 307/455 X

FOREIGN PATENT DOCUMENTS 0163920 9/1984 Japan .................................. 307/455
2110029 6/1983 United Kingdom ............... 307/455

Primary Examiner—Stanley D. Miller
Assistant Examiner—D. R. Hudspeth
Attorney, Agent, or Firm—Patrick T. King; Davis Chin; J. Vincent Tortolano

[57] ABSTRACT

An improved ECL circuit in which reference voltages have been eliminated is provided. The base of the reference switching transistor which is usually connected to a reference voltage is instead connected to the emitter of an emitter follower transistor coupled to the input switching transistor. The need for a reference voltage is thus eliminated because the emitter of such emitter follower transistor, and thus the base of the reference switching transistor, will be at the opposite level of the input to the base of the input switching transistor.

5 Claims, 4 Drawing Figures

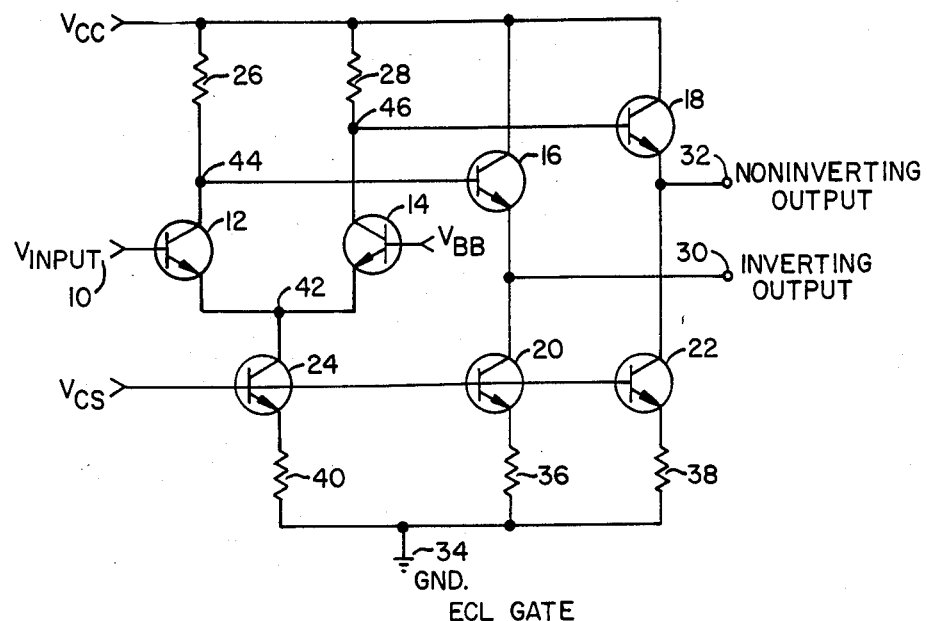
FIG._1.   PRIOR ART
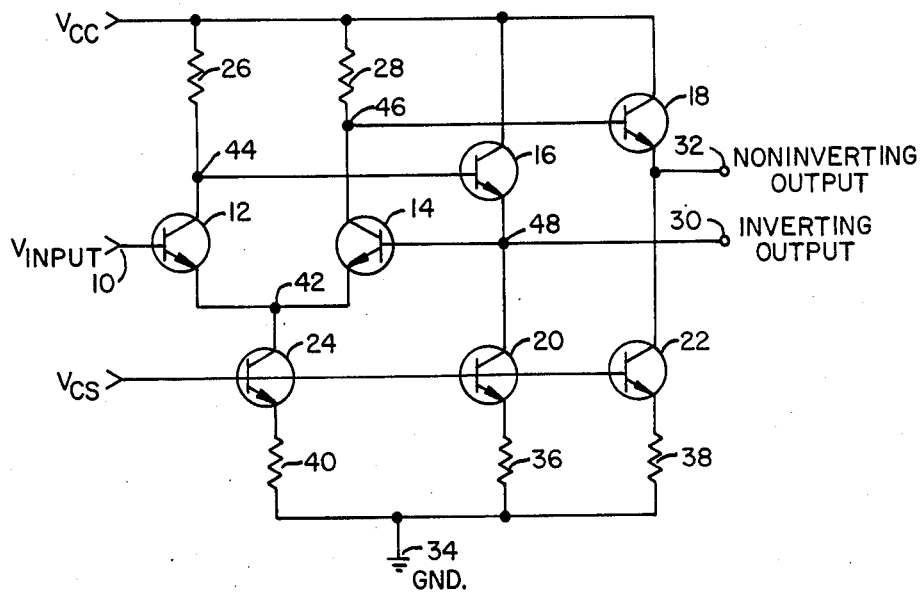
FIG._2.

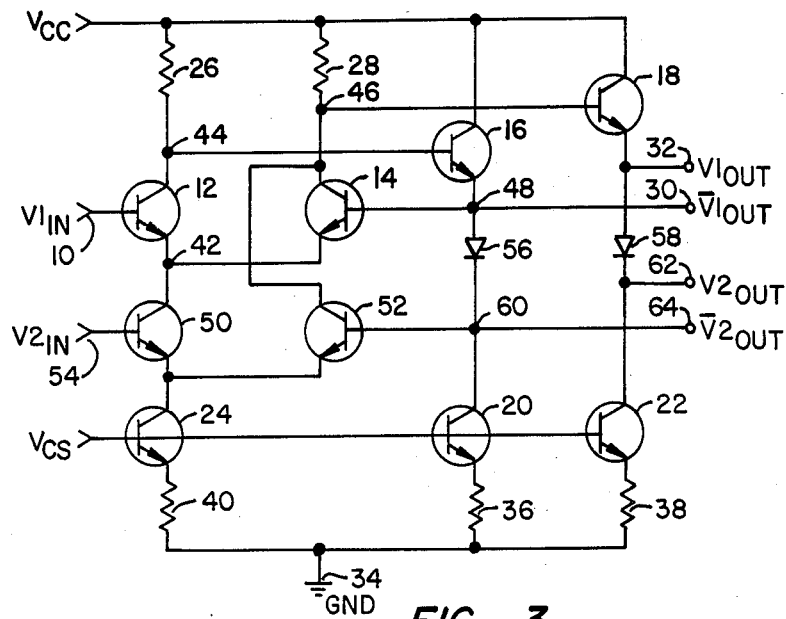
FIG._3.
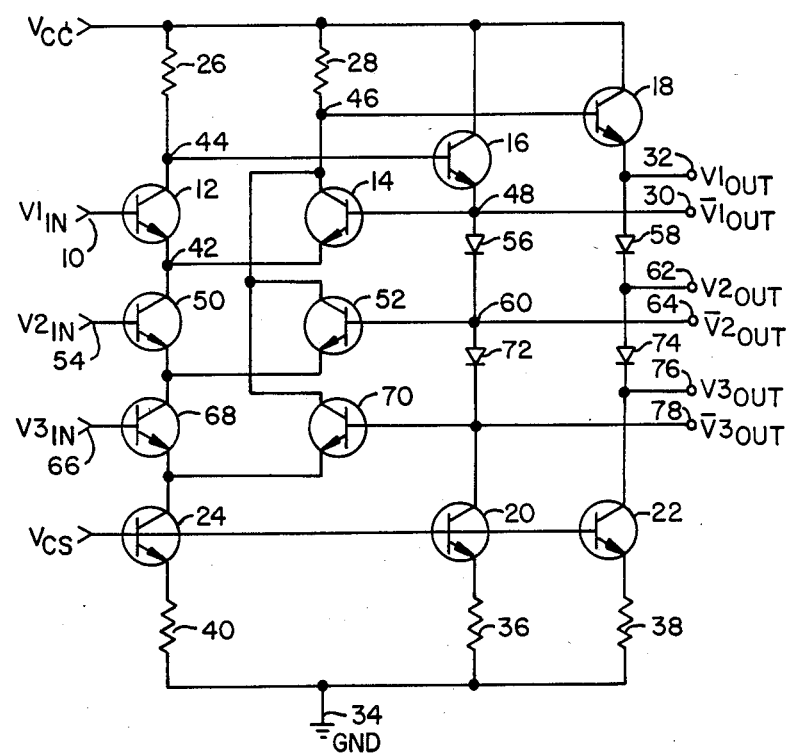
FIG._4.

ECL GATE CIRCUIT HAVING INTERNALLY GENERATED REFERENCE VOLTAGES

BACKGROUND OF THE INVENTION

This invention relates to emitter-coupled logic (ECL) circuits.

In a standard ECL circuit as shown in FIG. 1, two switching transistors 12 and 14 are connected at their emitters with the base of switching transistor 14 being connected to a reference voltage. The base of switching transistor 12 is connected to an input voltage. The connected emitters are connected to a current source transistor 24 which provides the current to the two switching transistors. The collectors of emitter-coupled transistors 12, 14 are connected via resistances to a power supply $V_{cc}$. An output is obtained at the collector of each switching transistor upon application of an input voltage with one transistor providing a non-inverting output, and the other providing an inverting output. Each output is connected to an emitter follower transistor which isolates the switching transistor's collector from the output. The emitter of each emitter follower is the output and is also connected to a current source transistor.

The reference voltage is referenced to the $V_{cc}$ supply and is normally generated at a single spot in an ECL integrated circuit and supplied throughout the whole chip via a bus line. Thus, the reference level has a high capacitance associated with it due to the extent of bus routing required. Additionally, the use of a reference voltage requires more power for the circuit.

The $V_{cc}$ supply voltage can vary due to noise, particularly due to noise generated by a large number of outputs changing states at the same time. Because of the capacitance associated with the reference voltage lines, the reference voltage is slow to respond to noise on the $V_{cc}$ power supply line. Thus, during dynamic operation of the chip, malfunctions or oscillations can occur due to the $V_{cc}$ noise.

In addition, because of the noise present on the reference voltage line, the high and low levels used must be sufficiently far apart to provide a margin for such noise. This results in a large voltage swing and thus a slow switching time.

One solution to some of the problems of a reference voltage is shown in an article appearing in the February, 1977 issue of *IEEE Journal of Solid-State Circuits*, entitled "Improved Feedback ECL Gate with Low Delay-Power Product for the Subnanosecond Region," authored by Hans-Martin Rein and Roland Ranfft which shows an ECL gate without a reference voltage (the "Rein circuit"). The base of the transistor usually connected to a reference voltage is instead coupled to the collector of the input switching transistor. The circuit shown, however, does not include the emitter follower transistors found in an ECL circuit. The Rein circuit is not suitable to drive capacitive loads because of the slow response time due to the collector resistance, R2, limiting the current which can charge a load capacitance.

The need for the reference voltage in the Rein circuit is eliminated by utilizing feedback from the collector of the input transistor to provide the reference voltage level. When the input is low, the input transistor is off and its collector is thus hgh, resulting in a high reference voltage. When the input changes to a high state, the input transistor turns on, simultaneously pulling its collector, and thus the reference voltage, low. Thus, the input will exceed the reference voltage and the transistor will switch states. A drawback, however, is that the high level of the output is reduced due to a voltage drop from current flowing through the collector resistor to the base of the reference transistor. This voltage drop is not present where a reference voltage is used and there is no such connection to the collector resistor. The voltage drop is increased by current flowing into a connected load. The lower high-level voltage makes the circuit more susceptible to noise and thus less reliable.

Noise is even a greater problem where two-level operation of ECL gates is used. In two-level operation, a first level of circuits operate between a logic low and high of given voltages. The second-level circuits operate between different low and high voltages.

An understanding of two-level circuits may be aided by considering the operation of an AND gate in two-level circuits. An AND gate would indicate a logic high only if both inputs were high, and otherwise would indicate a logic low. In two-level operation, the same rules apply except that the logic high of one input is at a different level than the logic high of the other input. Additionally, logic outputs are provided at each voltage level.

Two-level operation requires two reference voltage levels. Thus the problems discussed above for a single reference voltage are doubled. In addition, only two voltage levels are practical with a standard five-volt supply because of the need to provide sufficient separation between the high and low of each level to avoid noise problems.

SUMMARY OF THE INVENTION

The invention is an improved ECL circuit in which reference voltages have been eliminated. The base of the reference switching transistor which is usually connected to a reference voltage is instead connected to the emitter of an emitter follower transistor coupled to the input switching transistor. The need for a reference voltage is thus eliminated because the emitter of such emitter follower transistor, and thus the base of the reference switching transistor, will be at the opposite level of the input to the base of the input switching transistor. The use of the emitter follower, rather than the switching transistor, to provide feedback improves the performance of the circuit.

In operation, when the input is low, the input transistor is turned off and its collector is high, thus the emitter of the emitter follower is pulled high, giving a high level at the base of the reference switching transistor and a high output equal to the voltage supply level, $V_{cc}$, less the voltage drop across the emitter follower transistor's base-emitter junction, $V_{be}$. When the input changes to a high level, the input transistor turns on, pulling its collector low by the voltage drop, $V_s$, across the collector resistor. The low collector voltage results in a low voltage at the emitter follower's emitter of $V_{cc}-V_{be}-V_s$. This low voltage turns off the reference switching transistor and gives a low level output.

The dynamic operation of the circuit has regenerative feedback action due to the reference voltage changing states simultaneously with the input. This results in a quick transition which is facilitated because the emitter follower can supply the needed current. Since no reference voltage with its noise margin requirement is present, the voltage swing $V_s$ (which is the difference between the high and low outputs) can be chosen to be smaller than in conventional ECL gates, further improving the transition time.

Because the emitter follower has no collector resistor, the high-level output is not reduced by a collector resistor voltage drop. The lack of degradation of the high-level output gives an improved noise margin. In addition, the emitter follower can easily supply the current requirements of the base of the reference switching transistor and the load, and can charge the load capacitance quickly.

In one preferred embodiment, the referenceless ECL circuit is used to form a two-level AND gate by inserting another emitter-coupled switching transistor pair between the first switching transistor pair and the current source transistor. The collector of the second input transistor is connected to the coupled emitters of the first switching transistor pair, while the collector of the second reference transistor is connected to the collector of the reference transistor for the first switching transistor pair. The base of the second reference transistor is also coupled to the emitter follower of the first input transistor through a diode. The diode provides a voltage drop sufficient to provide a second reference level and an inverting output at such second level. A diode coupled to the emitter of the non-inverting emitter-follower output provides a second-level non-inverting output.

In operation, the two-level referenceless AND gate works for the first-level input in the same manner as the single-level referenceless ECL gate described above. However, the first emitter-coupled switching transistor pair will not change output states unless the second switching transistor pair allows current to be conducted. The second switching transistor pair will allow current to be conducted only when the second-level input changes to a high state relative to the voltage level provided to the base of the second reference transistor by the diode described above. Thus a high-level output will be generated only if a high level is applied to each input.

Additional levels can be added in a similar manner as desired. Because no reference voltages are used, and thus no allowance for reference voltage noise need be made, a two-level circuit can operate with less than a standard five-volt supply. Alternately, three-level operation can be achieved with a standard five-volt supply. The difference between the reference voltage levels is determined by the voltage drop across a diode, thus allowing voltage levels which are much closer together.

The use of closer voltage levels reduces the voltage swing when output states are changed and thus increases the speed of the circuit. Power usage of the circuit is reduced because no reference voltages are used. The chip circuitry is easier to lay out because there is no need to route reference voltage lines.

BRIEF DESCRIPTION OF THE DRAWINGS

FIG. 1 is a schematic drawing of a prior art ECL gate.

FIG. 2 is a schematic drawing of a preferred embodiment of a referenceless ECL gate.

FIG. 3 is a schematic drawing of the preferred embodiment of a two-level AND gate utilizing referenceless ECL logic.

FIG. 4 is a schematic diagram of the preferred embodiment of a three-level AND gate utilizing referenceless ECL logic.

DETAILED DESCRIPTION OF THE PREFERRED EMBODIMENT

The present invention is best understood with reference to the operation of a conventional ECL gate as shown in FIG. 1. An input 10 is connected to the base of an input switching transistor 12. Transistor 12 has its emitter coupled to the emitter of a reference switching transistor 14. Transistors 12 and 14 form the emitter-coupled switching transistor pair. Emitter follower transistors 16 and 18 are coupled to the respective collectors of transistors 12 and 14 to isolate such collectors from the output loads. Emitter follower transistors 16 and 18 are coupled to current source transistors 20 and 22, respectively. A third current source transistor 24 is coupled to the emitters of the emitter-coupled transistors 12 and 14.

The base of transistor 14 is connected to a reference voltage $V_{bb}$. The collectors of transistors 12 and 14 are coupled to a supply voltage $V_{cc}$ via resistors 26 and 28, respectively. The collectors of transistors 12 and 14 are also coupled to the bases of emitter follower transistors 16 and 18, respectively. The emitters of emitter follower transistors 16 and 18 are connected to outputs 30 and 32, respectively. Output 30 is an inverting output while output 32 is a non-inverting output. The emitters of emitter followers 16 and 18 are also coupled to the collectors of current source transistors 20 and 22, respectively.

The emitters of current source transistors 20, 22 and 24 are coupled to ground 34 via resistors 36, 38 and 40, respectively. Alternately, rather than ground a voltage which is low relative to the supply voltage, $V_{cc}$, could be used. The bases of current source transistors 20, 22 and 24 are connected to a current source voltage $V_{cs}$.

In operation, a current I is pulled from the emitters of emitter transistors 12 and 14 to ground 34 by current source transistor 24. The value of this current is determined by the voltage drop across resistor 40, which is equal to $V_{cs}$ less the base-emitter voltage of transistor 24. Substantially all of this current will flow through one or the other of emitter-coupled transistors 12 and 14, depending upon whether input 10 is above or below reference voltage $V_{bb}$.

The voltage at the coupled emitters of transistors 12 and 14, node 42, is determined by the value $V_{bb}$ less the base-emitter voltage drop of transistor 14. When input 10 is low, the voltage at node 42 reverse biases the base-emitter junction of transistor 12, thus shutting off transistor 12 so that substantially all current flows through transistor 14. When input 10 is high, the base-emitter junction of transistor 12 is forward biased, causing current to flow through transistor 12. The high input voltage has the effect of raising the voltage level of node 42, thereby reverse biasing the base-emitter junction of transistor 14. Thus, transistor 14 is turned off and substantially all of the current flows through transistor 12.

For purposes of example, consider input 10 going from a low to a high state. As discussed before, transistor 12 will turn on, thereby forcing all of current I to flow through resistor 26. This forces node 44 to a low state determined by the voltage drop, $V_s$, across resistor 26. At the same time, transistor 14 is turned off as discussed above, and virtually no current flows through resistor 28. Therefore, node 46 is pulled up to the value of $V_{cc}$. The high voltage at node 46 causes a high voltage at the base of emitter follower transistor 18, resulting in a high voltage at its emitter which causes current to flow through transistor 18 to output 32. This current will charge the capacitance of the load connected to the output to a high state. The time required to charge such capacitance is directly proportional to the voltage difference between the low state and the high state.

Returning to node 44, when it changes to a low state, the base of emitter follower transistor 16 is forced to a low state, and thus output 30 is brought to a low state equal to the low voltage at node 44 less the base-emitter voltage drop of transistor 16. When output 30 changes to a low state, the capacitance of the load connected to such output is discharged. The current from such capacitance flows through current source transistor 20 to ground. The amount of such current is determined by the value of resistor 36, in the same manner as discussed above for resistor 38. The amount of time required to discharge such capacitance is directly proportional to the voltage difference between the low state and the high state.

In FIG. 2 there is shown a first preferred embodiment of the present invention. The circuit is similar to the prior art circuit of FIG. 1 except that the output of the inverting emitter follower 16 is coupled to the input of the non-inverting transistor 14 at a node 48, thereby eliminating reference voltage $V_{bb}$ of FIG. 1. The operation of the circuit can be understood by considering low and high inputs. When input 10 is low, transistor 12 is turned off and node 44 is pulled up to $V_{cc}$. The voltage at node 48 is thus $V_{cc}-V_{be}$, where $V_{be}$ is the base emitter voltage drop across transistor 16. This is a logic high which turns on transistor 14 and pulls current through the collector of transistor 14 and resistor 28. Node 46 is pulled down by an amount equal to the voltage drop across transistor 28, giving a voltage swing $V_s$. The voltage at output 32 is thus $V_{cc}-V_s-V_{be}$. This is a logic low which results when a logic low has been applied to input 10.

Similarly, when input 10 is high, transistor 12 will be conducting and node 44 will be low. Node 48 will be equal to $V_{cc}-V_s-V_{be}$, or a logic low. This logic low will turn off transistor 14 and thus node 46 will be pulled high to $V_{cc}$, causing the emitter of emitter follower 18 to go high. Output 32 will be equal to $V_{cc}-V_{be}$, which is a logic high.

The dynamic operation of the circuit is as follows. When input 10 goes from a low to a high state, node 44 is initially high. Node 42 is initially at a level of $V_{cc}-2V_{be}$. As the input nears $V_{cc}-V_{be}$, the base-emitter junction of transistor 12 becomes forward biased and current begins to flow in resistor 26, thus reducing voltage at nodes 44 and 48. As the voltage at node 48 is lowered, the current flowing through transistor 14 is reduced, shutting off transistor 14, allowing less current to flow through resistor 28, and forcing more current to flow through resistor 26. Thus, regenerative feedback action occurs which causes the transition to become completed very quickly. A similar effect occurs during a high to low transition at input 10. But in the case of a high to low transition, the regenerative effect starts when the input voltage 10 is near to the logic low voltage, $V_{cc}-V_{be}-V_s$. Thus, the circuit exhibits little hysteresis which can be further reduced by reducing the amount of voltage swing $V_s$.

Conventional ECL circuits require large voltage swing $V_s$ because the voltage is referenced around a reference voltage. This large voltage swing is responsible for causing large delays in conventional ECL circuits. The present circuit is referenceless, and thus can use a much lower voltage swing (approximately 0.4 volts or less). This not only reduces the hysteresis but also reduces the delays significantly. By coupling the base of transistor 14 to the emitter of transistor 16, a higher high-level output is possible than if said base were connected to node 44 and a load. This is because a voltage drop across resistor 26 due to a load being coupled to node 44 is avoided. Thus emitter follower 16 can easily supply the needed current to the base of transistor 14 and a load.

Another advantage of the present invention is that it can be operated at a reduced supply voltage level. Conversely, with conventional 5-volt supply, a three-level gate can be constructed and operated as opposed to the two-level gate presently possible.

A schematic diagram of a preferred embodiment of a two-level AND gate utilizing referenceless ECL circuitry is shown in FIG. 3. The circuit is identical to that of FIG. 2 except as follows. A second pair of emitter-switching coupled transistors consisting of a transistor 50 and a transistor 52 with a second-level input 54 have been added. A diode 56 couples node 48 to the base of transistor 52 at a node 60 and a diode 58 is coupled between output 32 and the collector of transistor 22 to provide a second-level output 62. Node 60 is coupled to the collector of current source transistor 20 and provides a second-level inverting output 64.

The operation of the circuit with respect to input 10 and outputs 32 and 30 is identical to that described for the circuit of FIG. 2 above, except that transistor 12 cannot turn on and thereby cause output 32 to go high unless transistor 50 is also turned on. Transistor 50 will turn on when input 54 is at a second level logic high, thereby giving the AND operation of requiring that both inputs 10 and 54 be at logic highs to give a logic high output for output 32. The voltage level for input 54, however, is a lower level operation since to turn on input transistor 50, the input high at 54 need not exceed the node voltage at 48 as the input at input 10 is required to. Rather, input 54 need exceed only the reference voltage at node 60, which is the voltage at node 48 less the voltage drop across diode 56. It can be seen that the voltages at nodes or outputs 60 and 62 merely track the voltages at outputs 32 and 30, but at a lower voltage level or lower level operation.

Referring to FIG. 4, an additional voltage level input 66 can be added to the circuit of FIG. 3 with emitter-coupled transistors 68 and 70 and diodes 72 and 74 producing third-level outputs 76 and 78. The coupled emitter of transistors 68 and 70 are coupled to the collector of current source transistor 24. The collector of transistor 68 is coupled to the emitters of transistors 50 and 52. The collector of transistor 70 is coupled to the collector of transistors 52 and 14. Diode 72 has its anode coupled to node 64 and its cathode coupled to the base of transistor 70 and the collector of current source transistor 20 to give third-level inverting output 78. Diode 74 has its anode coupled to output 60 and its cathode coupled to the collector of current source transistor 22 to give 76.

The operation of this circuit is again similar to that of the circuit of FIG. 3 with the added requirement that transistor 68 must be turned on in order for transistors 12 and 50 to conduct. Thus, a logic high is required at all three inputs 10, 54 and 66 in order to produce a logic high output at outputs 32, 60 and 76. Diode 72 provides a reference level for input 66 which is the reference voltage at node 64 less voltage drop across diode 72.

The value of the supply voltage $V_{cc}$ which is required to operate a referenceless ECL gate such as that of FIG. 4 is shown by the following equation:

$$V_{cc}(n) \geq (n+3/2) V_{be} + V_r$$

where:

$V_{cc}(n) = V_{cc}$ required for n level operation
n = number of levels;
$V_{be}$ = base-emitter voltage of a transistor;
$V_r$ = voltage across the current source resistor which is equal to the voltage swing $V_s$ (if resistor 26 and resistor 28 are equal to resistor 40 in value).

A voltage swing of 0.4 volts is used to provide enough margin for noise and to make sure the transition occurs, although theoretically a lower value could be used. Considering the worst-case condition at a cold temperature where $V_{be}$ equals approximately 0.9 volts, the minimum values for $V_{cc}$ are as follows:

$V_{cc}(1) = 2.65$ volts;
$V_{cc}(2) = 3.55$ volts;
$V_{cc}(3) = 4.45$ volts.

Thus, it can be seen that three-level operation as shown in FIG. 4 is possible with a standard 5-volt supply.

As will be understood by those familiar with the art, the present invention may be embodied in other specific forms without departing from the spirit or essential characteristics thereof. For instance, a number of input switching transistors could be coupled in parallel to give a OR/NOR function. Accordingly, a disclosure of the preferred embodiments of the invention is to be illustrative, but not limiting, of the scope of the invention which is set forth in the following claims.

What is claimed is:

1. An emitter coupled logic (ECL) gate circuit having internally generated reference voltages in which externally generated reference voltages are eliminated, said circuit comprising:
    a first level of switching transistors being formed of a first input transistor and a first reference transistor, said first input transistor and said first reference transistor having their emitters coupled to a current source, said first input transistor having its base coupled to a first level input terminal, said first reference transistor having a base and collector;
    first and second emitter follower transistors, said first emitter follower transistor being coupled to said first reference transistor, said second emitter follower transistor being coupled to said first input transistor, said second emitter follower transistor having its emitter coupled to the base of said first reference transistor;
    at least a second level of switching transistors being formed of a second input transistor and a second reference transistor, said second level of switching transistors coupling said first level of switching transistors to said current source, said second input transistor and said second reference transistor having their emitters coupled to said current source, said second input transistor having its base coupled to a second level input terminal and its collector coupled to the emitters of said first level of switching transistors, said second reference transistor having a base and collector, said second reference transistor having its collector coupled to the collector of said first reference transistor; and
    means, coupling the base of said first reference transistor to the base of said second reference transistor, for producing a second level reference voltage substantially proportional to a first level reference voltage at the base of said first reference transistor.

2. The ECL circuit of claim 1 wherein said means for producing the second level reference voltage is a first diode with its anode coupled to the base of said first reference transistor.

3. The ECL circuit of claim 2 further comprising:
    a second diode having its anode coupled to the emitter of said first emitter follower transistor to provide a second level non-inverting outupt at the cathode of said second diode.

4. The ECL circuit of claim 3 further comprising:
    a third level of switching transistors being formed of a third input transistor and a third reference transistor, said third level of switching transistors coupling said second level of switching transistors to said current source, said third input transistor and said third reference transistor having their emitters coupled to said current source, said third input transistor having its base coupled to a third level input terminal and its collector coupled to the emitters of said second level of switching transistors, said third reference transistor having a base and a collector, said third reference transistor having its collector coupled to the collector of said second reference transistor; and
    a third diode coupling the base of said second reference transistor to the base of said third reference transistor with the anode of said third diode being coupled to the base of said second reference transistor.

5. The ECL circuit of claim 4 further comprising:
    a fourth diode having its anode coupled to the cathode of said second diode to provide a third level non-inverting output at the cathode of said fourth diode.

* * * * *